("12") United States Patent
Moxley, III

(10) Patent No.: US 10,775,173 B2
(45) Date of Patent: Sep. 15, 2020

(54) ROOM-TEMPERATURE EXCITON-POLARITON SUPERFLUID QUANTUM INTERFERENCE DEVICE AND QUATRON-POLARITON SUPERCONDUCTING QUANTUM INTERFERENCE DEVICE

(71) Applicant: Frederick Ira Moxley, III, Huntsville, AL (US)

(72) Inventor: Frederick Ira Moxley, III, Huntsville, AL (US)

(73) Assignee: Frederick Ira Moxley, Huntsville, AL (US)

( * ) Notice: Subject to any disclaimer, the term of this patent is extended or adjusted under 35 U.S.C. 154(b) by 0 days.

(21) Appl. No.: 16/358,071

(22) Filed: Mar. 19, 2019

(65) Prior Publication Data

US 2019/0212147 A1    Jul. 11, 2019

Related U.S. Application Data

(62) Division of application No. 15/402,149, filed on Jan. 9, 2017, now Pat. No. 10,281,278.
(Continued)

(51) Int. Cl.
*G01C 19/58* (2006.01)
*H01S 5/10* (2006.01)
(Continued)

(52) U.S. Cl.
CPC ........... *G01C 19/58* (2013.01); *G01R 33/032* (2013.01); *G01R 33/0354* (2013.01);
(Continued)

(58) Field of Classification Search
USPC ........................................................ 250/251
See application file for complete search history.

(56) References Cited

U.S. PATENT DOCUMENTS 7,843,209 B2 * 11/2010 Berkley ................. G06N 10/00
326/7
8,877,367 B2 * 11/2014 Holme ..................... H01G 9/02
429/144
2012/0212375 A1 * 8/2012 Depree, IV ........ H01Q 15/0086
343/700 MS

OTHER PUBLICATIONS

D. Snoke, "Polariton Condensates", Physics Today, Aug. 2010, pp. 42-47 (Year: 2010).*

(Continued)

*Primary Examiner* — Phillip A Johnston
(74) *Attorney, Agent, or Firm* — Polsinelli PC

(57) ABSTRACT

The present disclosure relates to Superfluid QUantum Interference Devices (SQUIDs) that measure phase differences existing in quasi-particles or matter-wave systems, and the related techniques for their use at room-temperatures. These Bose-Einstein Condensation interferometry techniques include quantum scale metrology devices such as quasi-particle based linear accelerometers, gyroscopes, and Inertial Measurement Units that incorporate such interferometers. In the presence of additive white Gaussian noise, estimates are made for the Bias Instability, Angle Random Walk, and Velocity Random Walk of the device for purposes of quantum inertial sensing. Moreover, this disclosure relates to SQUIDs based on charged quasi-particles that can, in turn, be used to construct quantum computing elements such as quantum transistors, and quasi-particle circuits at room-temperatures. These quasi-particle circuits can be used to build analogs of electronic circuit elements, and offer an alternative to traditional electronics. Using a quasi-particle circuit, hysteresis can be achieved and controlled to build these new devices.

18 Claims, 9 Drawing Sheets

Related U.S. Application Data

(60) Provisional application No. 62/275,953, filed on Jan. 7, 2016, provisional application No. 62/343,629, filed on May 31, 2016.

(51) Int. Cl.
| | |
|---|---|
| *G01R 33/035* | (2006.01) |
| *G01R 33/032* | (2006.01) |
| *G06N 10/00* | (2019.01) |
| *H01L 39/22* | (2006.01) |
| *H01S 5/04* | (2006.01) |
| *H01S 5/183* | (2006.01) |

(52) U.S. Cl.
CPC .......... *G06N 10/00* (2019.01); *H01L 39/223* (2013.01); *H01S 5/10* (2013.01); *H01S 5/041* (2013.01); *H01S 5/183* (2013.01)

(56) References Cited

OTHER PUBLICATIONS

Das; et. al, "Polariton Bose-Einstein condensate at room temperature in an Al(Ga)N nanowire-dielectric microcavity with a spatial potential trap", Proceedings of the National Academy of Science, Feb. 19, 2013, vol. 110, No. 8, pp. 2735-2740 (Year: 2013).*

Brachmann, "Inducing Vortices in a Bose-Einstein Condensate using light beams with orbital angular momentum", Diploma Thesis; Harvard University Department of Physics Cambridge, Massachusetts and Ludwig-Maximillians Universitat Fakultat fur Physik Munchen, Boston, Aug. 2007. pp. 1-88. (Year: 2007).*

* cited by examiner

ROOM-TEMPERATURE EXCITON-POLARITON SUPERFLUID QUANTUM INTERFERENCE DEVICE AND QUATRON-POLARITON SUPERCONDUCTING QUANTUM INTERFERENCE DEVICE

I. CROSS REFERENCE TO RELATED APPLICATIONS

This application claims priority to U.S. Provisional Application No. 62/275,953, filed Jan. 7, 2016, U.S. Provisional Application No. 62/343,629, filed May 31, 2016, and is a divisional application of U.S. patent application Ser. No. 15/402,149, filed Jan. 9, 2017, the contents of these applications are expressly incorporated herein in their entirety.

II. FIELD

The present disclosure relates to quantum interference devices that measure phase differences (for example) existing in quasi-particles and the related techniques for their use at room-temperatures.

III. BACKGROUND

In order to take measurements or extract phase information, interferometry relies on the superposition (i.e., interference of waves) that are typically electromagnetic. Interferometry has important applications in a wide range of scientific and engineering pursuits from astronomy to quantum mechanics, and particle physics. Generally speaking, interferometry makes use of the superposition of waves in such a way as their combination has some meaningful property that can be measured by way of the interference pattern created, which is indicative of the phase difference between the two or more waves. Waves that are in-phase undergo constructive interference while waves that are out of phase will undergo destructive interference. Waves that are neither completely in-phase, nor completely out-of-phase will create an interference pattern, which can be used to determine the relative phase difference between the waves. These phase differences can become apparent in the macroscopic phase of quantum condensed matter systems, thereby making them of interest for applications as quantum interference devices.

IV. BRIEF DESCRIPTIONS OF THE DRAWINGS

Implementations of the present technology will now be described, by way of example only, with reference to the enclosed figures, wherein.

V. DETAILED DESCRIPTION

Figure 1:
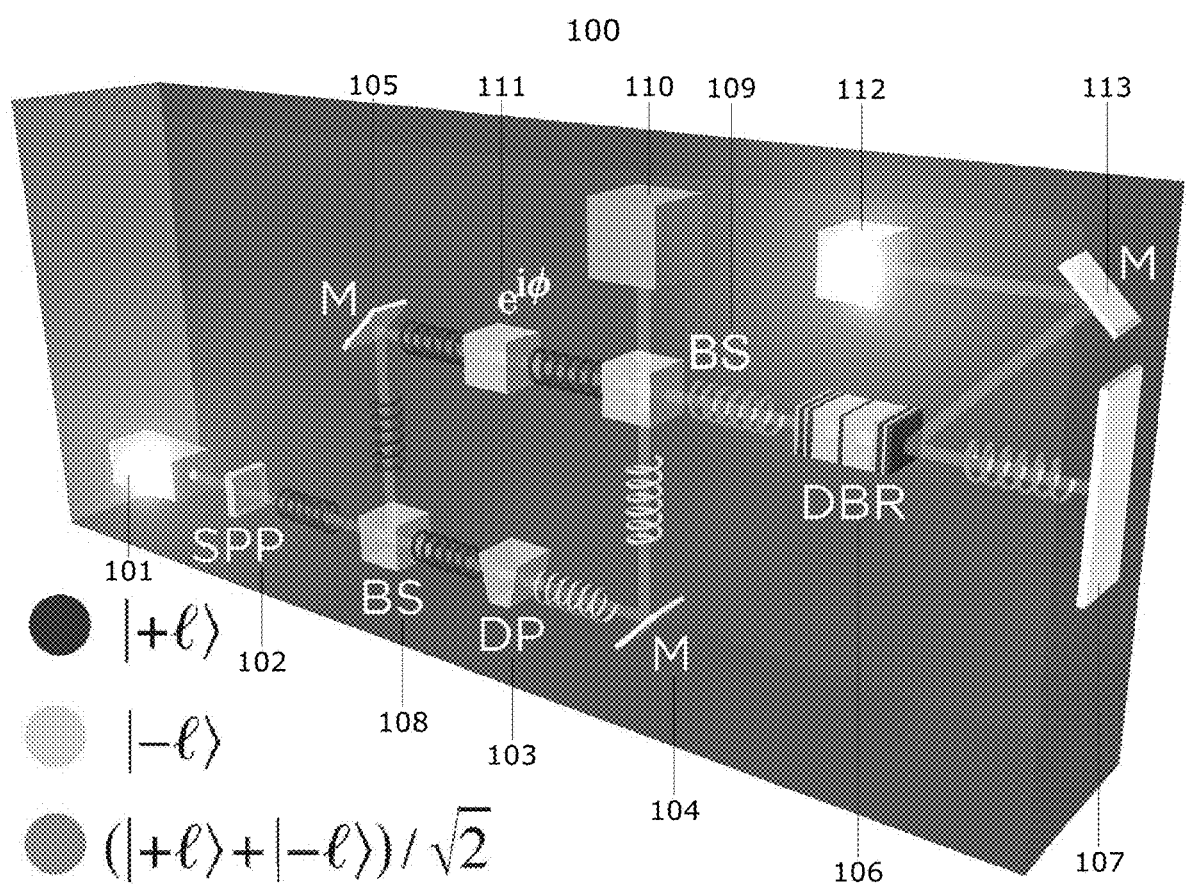
FIG. 1 is an isometric view of an example of a polariton Superfluid QUantum Interference Device (pSQUID) and a diagrammatic view of an experimental configuration for producing vortex-antivortex superpositions in accordance with the present disclosure.

The type of devices discussed herein will permit practical implementations of quantum memory, digital noise filters (e.g., Schmitt triggers), magnetometers (e.g., Superconducting QUantum Interference Devices or SQUIDs), qubits, qudits, and quantum Inertial Measurement Units (IMUs). For example, ultra-cold atomic gases offer highly attractive physical systems for realizing such quantum devices, as they offer an exquisite experimental control that originates from quantum optics, such as vortex or soliton creation in a BEC matter wave. However, one of the drawbacks of ultracold atom technology is that in order to achieve BEC, conditions need to be cooled to nano-kelvin temperatures, which can prove quite difficult and expensive. In order to overcome this challenge, the present disclosure employs quasi-particles, which can form BEC matter waves at room temperatures. Examples of the quasi-particles are exciton-polaritons, and quatron-polaritons. Exciton-polaritons are half-light, half-matter quasi-particles that result from combing quantum well excitons (i.e., electron-hole pairs) and photons via planar Fabry-Perot resonators, distributed Bragg reflector (DBR) microcavities, or photonic crystals, for example. Negatively charged quatrons are composed of a hole and three electrons in a semiconductor. Because quatron-polaritons (charge=$-2e$) and exciton-polaritons (charge=$0$) are optically accessible bosons, they offer an entirely new arena for engineering BECs at room temperature via quantum optics and a new configuration for achieving novel quantum devices such as optoelectronics (e.g., quantum circuits, ultra-fast optical switches), power production (e.g., hybrid organic-inorganic solar cells), and medicine (e.g., compact terahertz lasers). Herein, the disclosure utilizes the superfluid property of polariton condensates, and the superconducting property of quatron condensates, for achieving these examples according to the present disclosure.

It will be appreciated that for simplicity and clarity of illustration, where appropriate, reference numerals may have been repeated among the different figures to indicate corresponding or analogous elements. In addition, numerous specific details are set forth in order to provide a thorough understanding of the examples described herein. However, it will be understood by those of ordinary skill in the art that the examples described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the examples described herein.

Phase difference that is measured via interferometry is typically created by a difference in path length between a sample and reference beam that are created by splitting a single source of light, such as a laser. Even small differences in the path length of the sample beam can result in a phase difference in the detected, recombined beam.

Phase differences created by path length differentials are not the only phase change that can be measured by an interferometer. For example, a phase change can also result from a difference in refractive index between two paths of the same length.

Additionally, interferometers can also measure the phase differences created by differences in angular momentum existing in quantum vortex-antivortex superposition states, for example. The Orbital Angular Momentum (OAM) of light results in a so-called helical mode, which can be used to create these quantum vortex-antivortex superposition states in BECs. OAM states can occur naturally in light; however, there are a number of methods for creating OAM states in the laboratory. One method for creating an OAM state employs a Spiral Phase Plate (SPP). SPPs can be made of plastic or glass, for example, and are constructed such that the thickness of the material increases in a spiral pattern in order to imprint a phase gradient on light passing through it, which can in turn be transferred to a BEC. Alternatively, these OAM vortex-antivortex superposition states can be obtained via metastable condensation, where the condensate is placed in a circular narrow channel, i.e., ring potential. For the metastable condensation technique, the electrical injection of the condensate removes the need for optics. By eliminating the vortex core with the use of a ring potential, high OAM states become ultrastable, which is beneficial from a sensitivity point of view. Moreover, Josephson junctions can be placed in these ring potentials, thereby constituting quasi-particle analogues of SQUIDs. The magnitude of the barrier height of the junction creates a quasi-particle analogue of a Superconductor-NormalMetal-Superconductor (SNS) junction.

The Gouy phase and Sagnac phase are often measured in interferometer systems. The Gouy phase is the phase that a wave acquires as it changes its radius of curvature via diffraction. The Gouy phase of optical beams can be observed by the interference patterns that are created, i.e., superimposing a fundamental Gaussian beam going through a focal point with a plane wave. The Gouy phase and Sagnac phase can also originate from the interference of two counter-rotating OAM states.

Sagnac interferometers are often used for measuring angular velocity. The Sagnac interferometer splits the light from a single collimated source by way of a partially reflective mirror (e.g., beam splitter) into two beams that follow the same path but in the opposite directions and can be thought therefore to enclose an area. The relative phases of the two exiting beams, and thus the position of the interference pattern are shifted according to the angular velocity of the beams. This is also referred to as the Sagnac Effect.

Such interferometer arrangements have been incorporated into laser gyroscopes, and fiber optic gyroscopes, and the relative sensitivity of such gyroscopes arises from the invariance of the speed of light in all inertial frames of reference.

The Mach-Zehnder interferometer (MZI) is a type of Sagnac interferometer. An MZI also splits the light from a single collimated source using a partially reflective mirror (e.g., beam splitter). The two resulting beams are sometimes referred to as the "sample beam" and the "reference beam," as discussed above. Often for experimental purposes a sample (that alters the phase of this beam) is placed within the path of the sample beam.

Each sample and reference beam is reflected by a mirror; the two beams then pass through a second partially reflective mirror (e.g., Beam Splitter or BS) to enter one or two detectors. Depending on the presence (and nature) of a sample within the sample beam, different interference patterns are created at the detectors.

MZIs can be used for precision phase measurement. The sensitivity of MZIs for phase measurement is limited by the shot noise of the photons which scales as the inverse of the square root of the number of photons, although the shot noise can be suppressed by using squeezed states of light at the input of the MZI. Alternatively, the signal can be enhanced by optical parametric amplifiers. Combined with the squeezed state input, the sensitivity can be improved further due to the noise reduction, thereby permitting the "Heisenberg limit," which scales as the inverse of the number of photons.

Optical interferometers depend, to some extent, on the wavelength of the optical beam used, and thus are limited in sensitivity. Moreover, for example, optical Sagnac interferometers depend on the area of the configuration meaning that the sensitivity to rotation is proportional to the area circumscribed by the counter-rotating optical beams. Consequently, manufacturing an optical Sagnac interferometer in a compact form, thus having a lower relative circumscribed area, can come at the cost of a decrease in measurement sensitivity for a given wavelength. However, one advantage of optical interferometers is that they operate at room temperatures. Furthermore, such optical interferometers are relatively inexpensive.

An alternative to optical interferometers are atomic-based interferometers. Atomic interferometers make use of the properties of ultra-cold atomic gases and offer highly attractive physical systems for realizing very sensitive (i.e., $m_{eff}c^2/\hbar\omega \sim 10^{10}$), quantum-scale metrological devices for applications such as gyroscopes that employ the Sagnac effect. Atomic systems offer exquisite control that originates from quantum optics, such as vortex creation in a BEC matter wave, and are highly coherent, meaning the interference visibility can be used for interferometry.

Atomic BEC was first achieved in 1995 and inspired a massive worldwide research effort. Today, atomic BECs (for example, based on Helium isotopes) are being considered for applications in a variety of fields, such as quantum simulation, quantum information, as well as quantum metrology. BECs can exhibit a number of unusual physical properties, such as superfluidity, vortices, and attractive interactions.

The rotational measurement sensitivity of atomic matter wave interferometers per unit area typically far exceeds that of optical interferometers. Unfortunately, achieving BEC in atomic gases is very difficult and can typically only occur at nano-kelvin temperatures, rather than at room temperatures (i.e., approximately 300 Kelvin). As a result, atomic BEC interferometers can be impractical and extremely expensive.

Atomic BECs are not the only type of BECs that can be created. BECs can also be formed of quasi-particles. Quasi-particles are so-called emergent phenomena that occur when a system in a solid behaves as if it contained different weakly interacting particles in free space. For example, as an electron travels through a semiconductor, its motion is disturbed by its interactions with all of the other electrons and nuclei; however, it approximately behaves like an electron with a different mass (i.e., effective mass) travelling unperturbed through free space. Such an electron can be referred to as an electron quasi-particle.

As another example, the aggregate motion of electrons in the valence band of a semiconductor can be modeled as if the semiconductor instead contained positively charged quasi-particles called electron-holes or holes.

Polaritons are a class of quasi-particles resulting from the strong coupling of electromagnetic waves (e.g., light) within an electric or magnetic dipole carrying excitation. There are several types of polaritons. Exciton-polaritons result from the coupling of visible light with an exciton, i.e., an electron-hole pair.

Now with specific reference to FIG. 1, FIG. 1 illustrates a system 100 utilizing a MZI configured for producing vortex-antivortex superpositions in polariton BECs according to one aspect of the current disclosure. A laser 101 generates a Transverse Electromagnetic ($TEM_{r=0,p=0}$) Gaussian beam profile. This light is passed through a SPP 102, generating an OAM state of light. Once the OAM state of light has traveled through the MZI with a Dove prism (DP) 103 and mirrors (M) 104 and M 105, an OAM superposition state of light is made. The resulting OAM superposition state of light can be used to generate an interference pattern in a polariton BEC matter wave within the DBR microcavity 106. This interference pattern is imaged by a detector such as a charge-coupled device (CCD) 107, and can then be used to determine the Sagnac or Gouy phase of the polariton BEC, thereby constituting a pSQUID. Here, it should be pointed out that an annular potential can be placed in the DBR microcavity 106 such that a polariton superfluid ring can be generated. As such, Josephson junctions can also be placed in the annular potential in the DBR microcavity 106.

Figure 2:
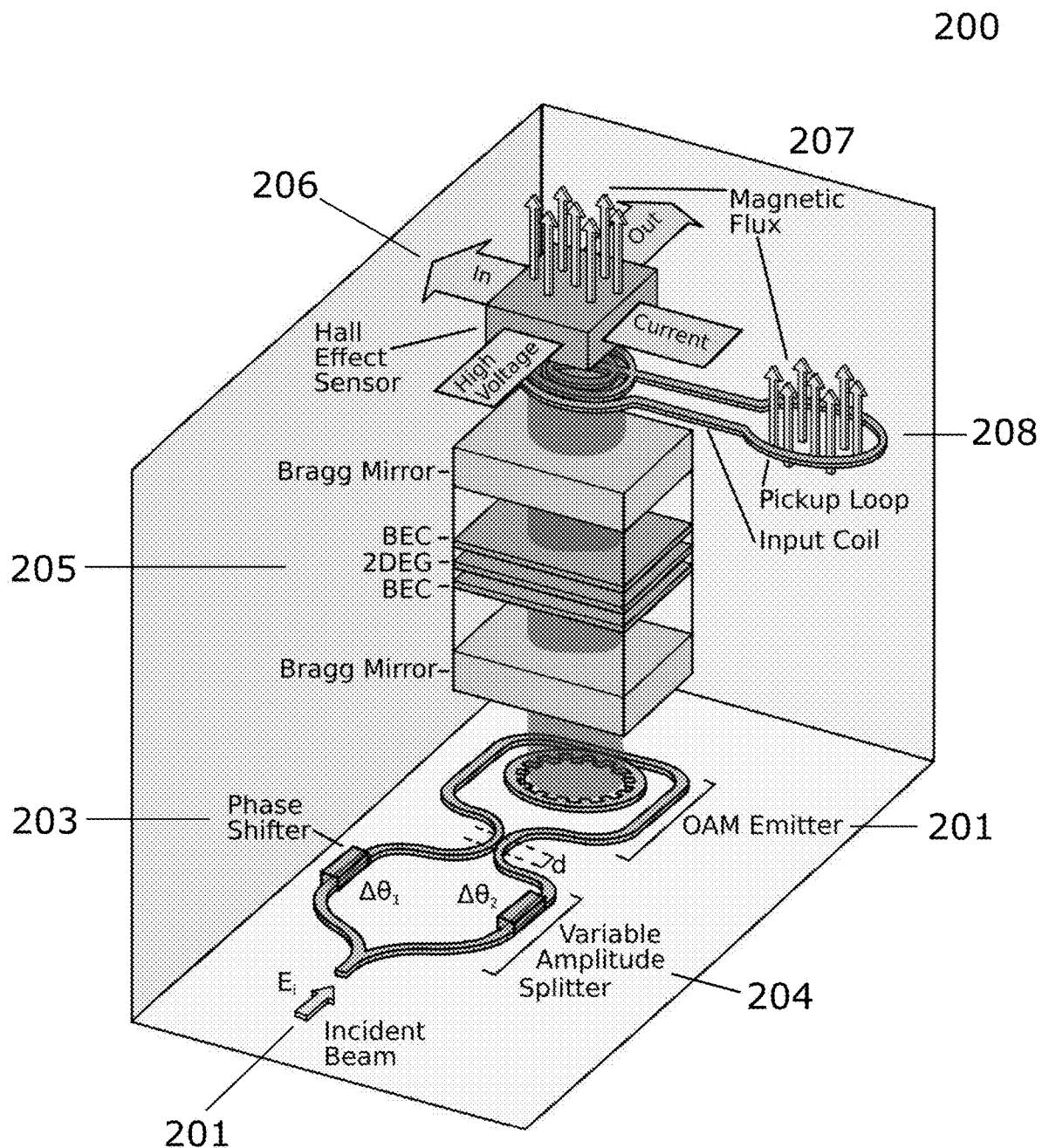
FIG. 2 is an isometric view of an example of a quatron Superconducting QUantum Interference Device (qSQUID) in accordance with the present disclosure.

As seen in FIG. 2, negatively charged quatron-polaritons are composed of a hole and three electrons in a triple-layered semiconductor microcavity, where a two-dimensional electron gas (2DEG) 205 layer is sandwiched between two BEC layers 205, for example. If coupled to superposition states of light from an OAM emitter 201, for example, they become stable. Because quatron-polaritons are optically accessible bosons, they offer a way for the OAM of light to be coupled to a BEC (e.g., in semiconductors), and are robust at room temperature. Moreover, this facilitates the entanglement of quasi-particle BECs, as OAM states of light can be entangled.

Hereinafter, "exciton-polaritons" will be referred to as "polaritons" for brevity and simplicity, while "quatron-polaritons" will be referred to as "quatrons" for similar reasons.

Polariton BECs are formed in semiconductor microcavities, planar dielectric Fabry-Perot optical cavities, or photonic crystals, for example, and can be described as half-matter, half-light excitations that are typically created using well-known laser injection methods.

Due to the de Broglie wavelength of the polaritons, a polariton superfluid is a type of BEC that can be achieved at much higher temperatures than atomic BECs. Superfluidity is the resistanceless flow of a fluid, and is fundamental to describing many unusual physical effects. Such effects include the superfluid fountain, the ability of a superfluid to resist rotation while inside a rotating container, and the ability to "defy" gravity.

Polariton BECs are a non-equilibrium phenomenon that can be achieved at room temperatures for suitable materials that support polaritons. In materials where polaritons can be operated at room temperature, interactions tend to be weaker; however more recently, the nonlinearities have been observed to be significant. Despite the non-equilibrium nature of the polariton BEC, it shares many of the properties of an atomic BEC, such as superfluidity, stable vortex formation, and high spatial coherence. Polaritons can have very high critical temperatures due to their exceedingly low effective mass (i.e., $10^{-5}$ times the bare electron mass). As discussed below, polariton BECs can be used to construct pSQUIDs.

Quatron BECs, as described above, carry negative charges and are useful because they exhibit superconducting properties. Again, quatrons are quasi-particles composed of a hole and three electrons which form a stable BEC when coupled to light in triple quantum layer structures in semiconductor microcavities, as seen in FIG. 2. This allows for both the greater experimental control found in quantum optics, and the benefits of matter wave systems, such as superconductivity and coherence. Moreover, due to the extremely small effective mass of the quasi-particles, quatrons can be used to achieve superconducting BECs at room temperature. As discussed below, quatron BECs can be used to construct qSQUIDs.

Hysteresis is a general feature of systems where the energy has two (or more) local minima separated by an energy barrier (e.g., a Josephson junction). For ring-shaped, quasi-particle BECs, these minima represent stable flow states of the system (e.g., counter-rotating electron-hole currents), and their energies can be altered via rotating the BEC with an angular velocity it, or rotating the Josephson junctions. As the quasi-particles interact with one another, an energy barrier can appear, creating multiple flow states. The energy barrier stabilizes the flow, making the quasi-particle BEC a superfluid, or superconductor.

These ring-shaped superfluids (or superconductors) exhibit both hysteresis and a critical angular velocity. As the rotation of the ring generates a quantized flux, the present device has applications as a novel flux qubit, for example. Additionally, owing to the optical coupling, these ring-shaped quasi-particle superfluids (or superconductors) can be entangled.

Superfluidity in polariton condensates are analogous to other systems (e.g., superfluid helium or atomic condensates) which sets them apart from other solid-state quantum systems. It has recently been demonstrated that hysteresis exists between quantized circulation states in a ring of superfluid atomic BEC obstructed by a rotating weak link. This was accomplished with a tunneling barrier such that there exists a region of low density in the superfluid ring.

Thus, according to one or more examples of the present disclosure, polariton-based interferometry can be conducted through the use of room-temperature polariton BECs. More particularly, OAM superpositions of light can be created and used as a seed to imprint these OAM state superpositions onto room-temperature polariton BEC clouds. The Sagnac or Gouy phase, for example, of the superposition of OAM states can be detected via the resulting interference pattern.

Through novel interferometer arrangements relying on the polariton BEC superposition states, sensitivity can be achieved in compact form factors exceeding what is possible with optical or atomic interferometers of the same occupied area. Moreover, because of the low relative effective mass of polaritons, the quasi-particle BEC can be created and sustained at room temperature conditions, unlike atomic BEC interferometers. As a result, such devices can achieve exquisite sensitivity while being chip-scale manufacturable and practical for device miniaturization purposes.

These polariton interferometers, with modifications discussed as part of other examples of the present disclosure, can be constructed to operate as linear accelerometers and gyroscopes, and thence combined to construct IMUs and other devices for related applications.

Other examples of the present disclosure permit the construction of quatron-based quantum transistors for use as elements in quantum-based logic and computations. The charged supercurrents found in room-temperature quatron BECs can be used to replace the voltage state representations of classical transistors, as discussed below, for example. In classical electronic transistors, information is encoded and accessed by manipulating and reading voltages on transistor switches located inside integrated circuits. Each electronic transistor is set to a voltage state of either 0 or 1 by a bus to encode bits of information. Devices based on qSQUIDs, however, can be used to construct quantum transistors, logic blocks, and quantum computing elements as they are set to a voltage states 0 and 1 simultaneously. This allows qSQUIDs to function as quantum bits (i.e., qubits), or qudits, as they encode the quantum information from the OAM states of light in the quatron BEC.

According to some examples of the present disclosure, the type of devices described will permit the construction of quantum memory components, digital noise filters (such as Schmitt triggers), magnetometers (e.g., SQUIDs), qubits, qudits, quantum IMUs, quantum Inertial Navigation Systems (INSs), and different varieties of interferometers that are based on quasi-particle physics rather than the well-known optical or atomic counterparts. Moverover, the examples of the present disclosure can be operational at room temperature (i.e., approximately 300 Kelvin). More particularly, OAM superpositions of light or electrical injection can be used as a seed to imprint superpositions states onto room temperature polariton BEC clouds. The Sagnac phase, Gouy phase, or magnetic flux quantum, for example, of the superposition states can then be detected via the resulting quantum interference patterns, or magnetic flux quantum.

According to other examples of the present disclosure, ring geometries are used where the polariton condensate is placed in a circular narrow channel potential well. An alternative method of forming the superposition states in a polariton BEC is via metastable condensation, where the ability of electrical injection of the BEC removes the need for optical injection.

These interferometers with modifications discussed as part of some examples of the present disclosure can be constructed to operate as linear accelerometers, gyroscopes, and hence combined to construct IMUs. Other examples of the present disclosure permit the construction of quatron based transistors for use as an element in quantum-based logic and computation.

Many lasers emit light coherent states which approximate a Gaussian profile with l=p=0. Using the $TEM_{00}$ fundamental transverse mode of the optical resonator and channeling it through a SPP, for example, OAM states of light can be generated. The resulting OAM state of light is sometimes referred to as a Laguerre-Gauss ($LG_{l,p}$) mode. The $LG_{l,p}$ optical state with a topological charge l is $$|l\rangle = \left(\frac{2}{\pi|l|!}\right)^{1/2} \frac{1}{w}\left(\frac{r\sqrt{2}}{w}\right)^{|l|} \exp\left(\frac{-r^2}{w^2}\right) \quad (1)$$

-continued
$$\exp(-il\phi)\exp(i[kz - kr^2/(2R)])\exp(i\phi),$$

where r, $\phi$, z are cylindrical coordinates, w is the beam waist, k is the wave number, R is the radius of curvature of the wave-front. Similarly, the $|-l\rangle$ state can be obtained by replacing $l$ with $-l$ in Eq. (1). Although these states can be made with holographs or cylindrical lens mode converters and other means, SPPs offer a simple and convenient way to obtain a pure OAM state.

Once pure OAM states are created, they can be made into OAM superposition states. One way to accomplish this superposition is by using a MZI, where a DP 103 is used to transform the OAM state. By altering the reflectivity of the first BS 108 and second BS 109 of the MZI, or altering the phase 111, an arbitrary superposition of the OAM states can be obtained.

The generated superposition of OAM states can be used to coherently excite the polaritons in, for example, a DBR structure 106. DBRs are semiconductor devices used to facilitate polariton BECs. As an alternative to semiconductors, photonic crystals, or polymers are materials that will also support the polariton BEC, for example. By exciting the polaritons accordingly, the seed of the polariton condensate is reinforced by the standard process of exciton-polariton cooling and scattering. Once the characteristic interference of the OAM superposition has been transferred to the polariton BEC, the Sagnac phase can then be determined from the angular velocity of the BEC cloud, and the Gouy phase can be determined from the linear velocity of the BEC cloud at the CCD 107.

The source of coherent light is a $TEM_{00}$ emitting laser 101. The beam of laser light is channeled through the SPP 102 to create an OAM state of light or a $LG_{l,p}$. This OAM state of light then travels through a first beam splitter (BS) 108. The partially reflective surface of BS 108 divides the beam into two arms according to its reflectivity.

The lower arm of the divided source of OAM state light passes through the DP 103. The DP 103 has the effect of creating a counter-rotating OAM state of light that serves as the antivortex to the OAM state of light exhibited by the upper arm of the MZI. The lower arm reflects from mirror (M) 104 and then is channeled into the second beam splitter BS 109, which in one example can be 50% reflective, 50% transmissive.

The upper arm reflects from mirror (M) 105 and is also channeled into the second beam splitter BS 109. In certain configurations, a sample can be placed at item 111, which may introduce a phase shift in the sample beam. The imaginary output 110 emerging from the second BS 109 is typically disregarded. The real output of the second BS 109 represents the superposition of the two OAM states. This superposition is channeled into the DBR microcavity 106, where (as discussed above) it serves as a seed polariton condensate.

The DBR 106 is itself pumped by a coherent light source 112. The output of source (e.g., laser) 112 is reflected by mirror (M) 113 to provide the hot polaritons for condensation by the DBR 106 using known techniques. The DBR 106, as will be discussed in more detail below, emits a luminescence that includes the interference pattern of the counter-rotating vortex-antivortex superposition states. This output from the DBR 106, containing the interference pattern, can be detected at 107, which is for example a CCD, and thus the Sagnac and Gouy phase of the polariton BEC can be determined using standard techniques. Alternatively, as will be discussed below other devices or configurations may be employed rather than a detector to achieve different measurements and effects.

The laser injection methods discussed above can be used to resonantly excite the polariton BEC. The phase of the light is directly imprinted on the polariton BEC system, thus the injected polaritons simply follow the same phase relation as the injected light. In this regard, there is no difference in using the OAM superposition states of light to the polariton BEC as the polaritons inherit their vortex nature from the light. However, once the initial coherent excitation is induced, the OAM superposition can be turned off and the microcavity system is excited by conventional polariton pumping. This can be performed by an off-resonant pumping where the excitons have a much higher energy than the polaritons, or by pumping at a high in-plane momenta. Either method creates a large population of uncondensed polaritons from which the polariton BEC is replenished.

Notably, apart from the initial seed polariton BEC which is induced coherently, the remaining population is not pumped with the OAM superposition state. Hence in the second phase where the conventional polariton BEC pumping is used, any OAM superposition state is a genuine steady state of the polariton BEC and possesses its own dynamics. Vortex-antivortex superpositions have a more complex phase relation than standard vortex configurations, and have the possibility to spontaneously separate spatially, or relax to a zero momentum state.

The spatiotemporal evolution of the non-equilibrium polariton system is described by the open-dissipative Gross-Pitaevskii (dGP) equation, expressed as:

$$i\frac{\partial \psi(x,t)}{\partial t} = \left[-\frac{\hbar}{2m_{eff}}\nabla^2 + V_{ext}(x) + g|\psi(x,t)|^2 + \frac{i}{2}(P(x) - \gamma - \eta|\psi(x,t)|^2)\right]\psi(x,t), \quad (2)$$

where $\omega(x, t)$ is a complex valued condensate order parameter, g is the polariton-polariton interaction constant, m is the polariton mass, $V_{ext}(x)$ is a spatially dependent trapping potential energy, $P(x)$ is a spatially dependent pumping rate, $\gamma$ is the polariton loss rate, and $\eta$ is the gain saturation. Throughout this disclosure the time scale is in units of $2ma^2/\hbar$, where a is the length scale set by the experiment (e.g., size of trapping potential or pump spot diameter). For the case of a Josephson junction in the ring geometry, the external potential $V_{ext}(x)$ will have two components. The first component of this potential is the static, trapping potential $$V_{trap}(x,y) = V_0 - V_0 \exp[-2(\sqrt{x^2+y^2}-R)^2/w^2], \quad (3)$$

where $V_0$, R, and w are set to approximate our model of the circular narrow channel potential. The second component is the potential that generates the Josephson junction, and is taken to be a Gaussian along the azimuthal direction and a rectangular potential in the radial direction. At $\theta=0$ the form of the Josephson junction potential $V_{JJ}$ is the product of a Gaussian along y and a rectangle along x:

$$V_{JJ}(x,y) = \exp[-2y^2/w_L^2]V_{up}(x, -L/2, a)V_{down}(x, L/2, a), \quad (4)$$

where $$V_{up}(x, x_{up}, a) = \frac{\tanh[a(x-x_{up})]+1}{2}, \quad (5)$$

and $$V_{down}(x, x_{down}, a) = \frac{\tanh[a(x_{down}-x)]+1}{2}. \quad (6)$$

Here, Eqs. (5) and (6) approximate step functions (i.e., $V_{up}$ and $V_{down}$). The quantities $x_{up}$ and $x_{down}$ denote the points where the steps up and down occur, respectively, and a is a parameter that controls the sharpness of the jump. The actual potential is $V_{JJ}(x', y')$ where x' and y' are the rotated coordinates:

$$x'(x,y,\theta) = x\cos(\theta) + y\sin(\theta), \quad (7)$$

and $$y'(x,y,\theta) = -x\sin(\theta) + y\cos(\theta). \quad (8)$$

Figure 3:
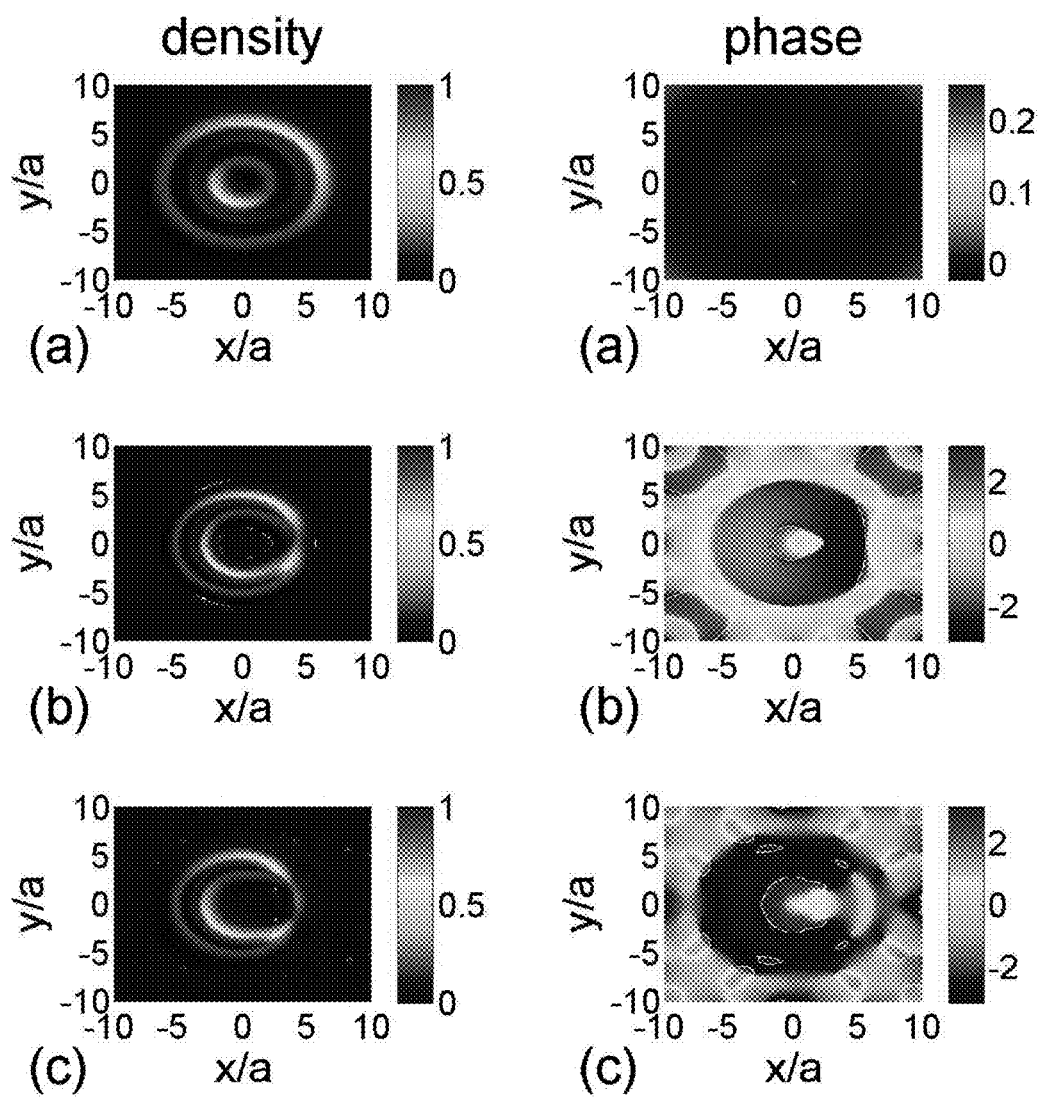
FIG. 3 is a time evolution of a polariton superfluid current in a ring geometry in the presence of a Josephson junction in accordance with the present disclosure.

FIG. 3 illustrates a basic implementation of the polariton superfluid currents in a ring geometry in the presence of a Josephson junction. Cases shown are (a) t=0; (b) t=5; (c) t=10. Parameters used in Eq. (2) are $\gamma=\eta=g=1$, and R=10 in Eq. (3). A spatially dependent pump $P(x, y)=P_0|\psi(x, y)|^2$, with $P_0=2$ is used. Timescales are in units of $2ma^2/\hbar$ where a is the lengthscale unit.

Figure 4:
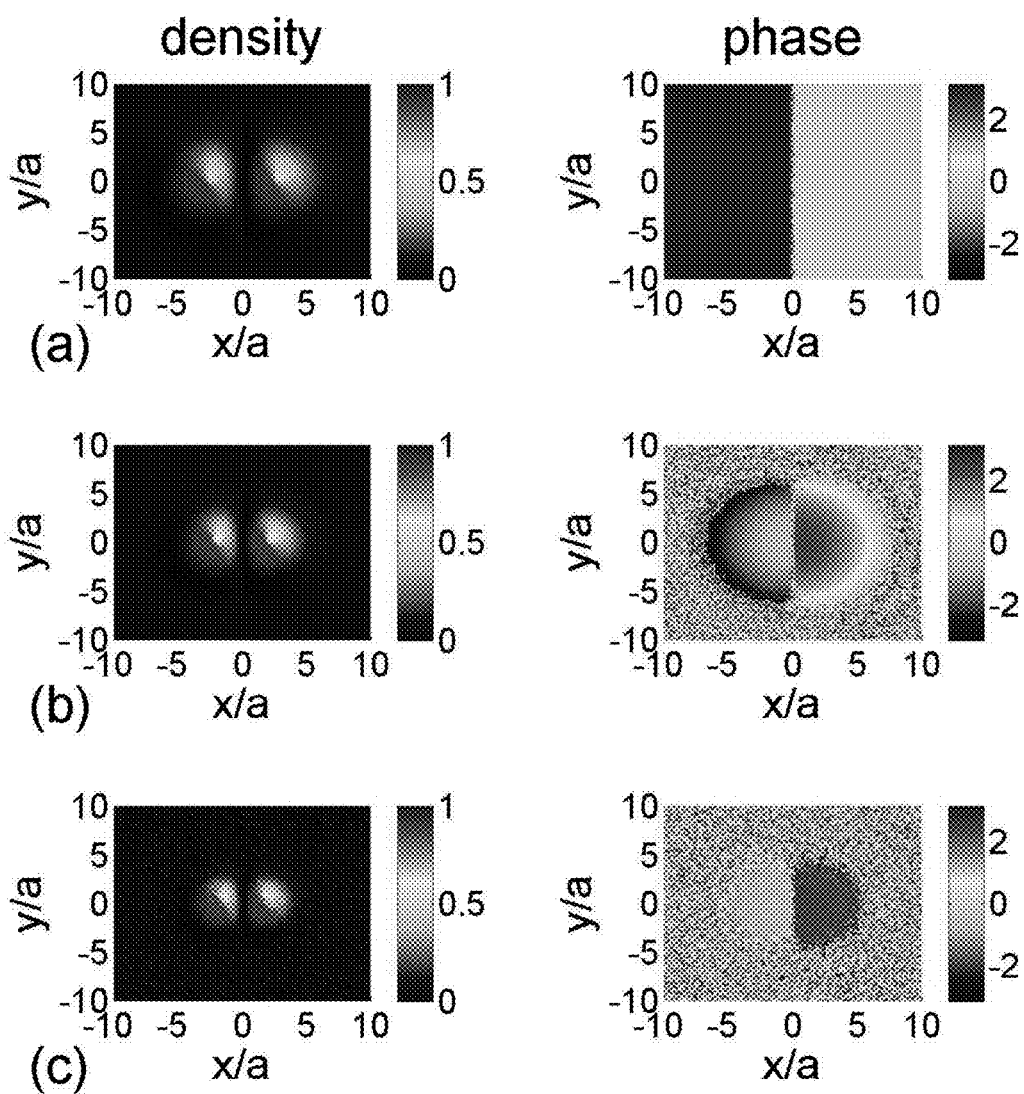
FIG. 4 is a diagrammatic view of a time evolution of a polariton Bose-Einstein condensate (BEC) in a disordered potential landscape in accordance with the present disclosure.

FIG. 4 illustrates a stable and coherent vortex-antivortex superposition. Moreover, the vortex-antivortex superposition has the characteristic phase dependence of the lobes being out of phase with each other by a factor of $\pi$. The system quickly reaches steady state and little change is seen beyond t=10. The stability of the counter-rotating vortex-antivortex superposition can be attributed to the same reason as for atomic BECs: both the vortex and the antivortex require a density defect due to the phase velocity diverging at the vortex core. Thus, it is energetically favorable for both to share the same vortex core, effectively pinning them in the same location. Time evolution of a polariton BEC initially seeded with a vortex-antivortex superposition for a disordered potential. FIG. 4 includes timeframes for (a) initial state t=0; (b) intermediate state t=5; and (c) steady-state t=10. Timescales are in units of $\hbar$/meV. The following parameters were used in the simulations: $\hbar g=0.05$, $\hbar\gamma=1.0$, and $\hbar\eta=0.1$, where energies are in meV.

Figure 5:
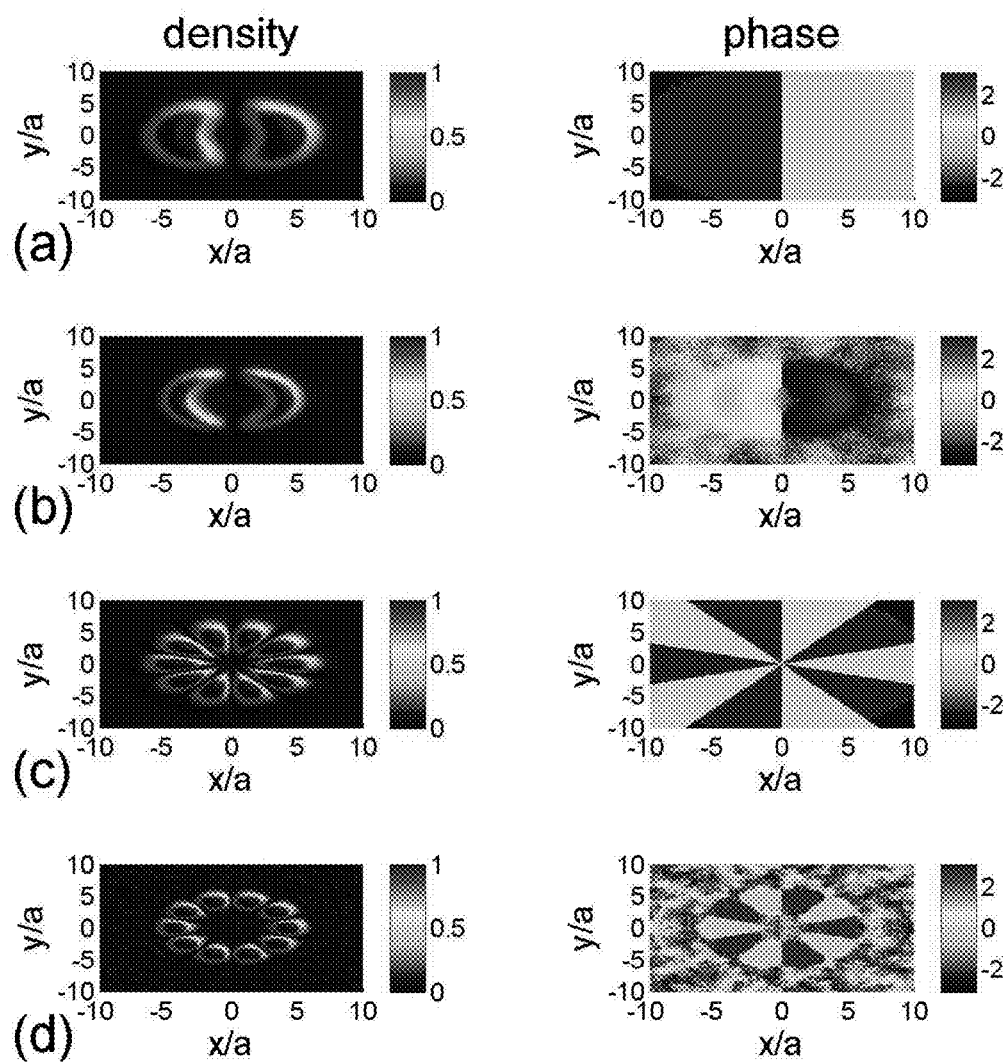
FIG. 5 is a diagrammatic view of a time evolution of a polariton BEC in a ring potential landscape in accordance with the present disclosure.

Generally, higher sensitivities of quantum interference are achieved by the use of high momentum states due to their relatively shorter wavelengths, which allow for higher resolutions. A variant of the vortex-antivortex superposition state within the scope of the present disclosure is to use ring geometries, where the polariton BEC is placed in a circular narrow channel potential, as seen in FIG. 5. In a BEC, high angular momentum states are energetically disfavored and typically multi-quantized vortices break up into many $l=\pm 1$ vortices. This can be understood from the high momentum states that are near the vortex core which have a rapid phase variation. By eliminating the vortex core with the use of a ring potential, high angular momentum states become ultra-stable, which is beneficial from a sensitivity point of view. To create such a higher angular momenta superposition, a metastable condensation technique is utilized, which can be accomplished by electrical injection of the polariton BEC. FIG. 5 is an example of the interference pattern of higher angular momentum states in a ring potential. This interference pattern can then be used to determine the Sagnac or Gouy phase, effectively making the superfluid polariton BEC a quantum inertial sensor. In FIG. 5, counterpropagating momentum currents are shown in ring geometries for (a) $l=\pm1$, $t=0$; (b) $l=\pm1$, $t=10$; (c) $l=\pm5$, $t=0$; (b) $l=\pm5$, $t=10$. Parameters used in Eq. (2) are $\gamma=\eta=V_0=g=1$, and R=5 in Eq. (3). A spatially dependent pump $P(x,y)=P_0|\psi_l(r,\phi)|^2$, with $P_0=2$ is used. Timescales are in units of $2ma^2/\hbar$ where a is the lengthscale unit.

From the interference pattern of the polariton BEC system as seen in FIGS. 4 and 5, when the device rotates in time, the two counter-rotating matter waves pick up different phases. The macroscopic quantum mechanical phase $\phi(t)$ accumulated over a given time duration can be calculated using the prescription of the Sagnac effect, or Gouy effect.

Superfluid polariton condensates can be described by a Landau two fluid model, with a macroscopic wavefunction $$\Psi(x,t) = \sqrt{\rho_s} \cdot \exp(i\phi(t)), \quad (9)$$

where $\rho$ is the superfluid density and $\phi(t)$ is the macroscopic phase. The superfluid mass current I across a Josephson junction can be written as $$I = I_0 \sin(\phi(t)), \quad (10)$$

and is analagous to a superconducting dc-Josephson equation, which is also valid for BECs. The phase difference $\phi(t)$ propagates in time according to a Josephson-Anderson phase equation $$\dot{\phi}(t) = -\frac{\Delta\mu}{\hbar} \quad (11)$$
$$= -\frac{m_{eff}(\Delta P/\rho_s - s\Delta T)}{\hbar},$$

where $m_{eff}$ is the effective mass of the constituent superfluid particles ($\sim 10^{-5}$ the electron mass for polaritons), $\rho_s$ is the superfluid density, s is the entropy per unit mass, $\Delta P$ and $\Delta T$ are the pressure and temperature differentials, respectively. For polariton BECs, a phase transition to superfluidity can occur below the transition temperature at a given density, or above the transition density at a given temperature. The critical transition temperature for a two-dimensional Bose gas is governed by the relation $$T_c = \frac{2\pi\hbar^2 n_2}{1.645 m_{eff} k_B}, \quad (12)$$

where $k_B$ is the Boltzmann constant. For a polariton gas with a number density of $n_3=3.5\times10^{11}$ [cm$^{-3}$], the two-dimensional concentration is $n_2=0.5\times10^8$ [cm$^{-2}$], which corresponds to room-temperature $T_c=300$ K. Near this transition temperature, oscillations are due either to Eq. (10) or to a linear current-phase relation with $2\pi$ phase slips. If a polariton superfluid loop contains two Josephson junctions in the annular potential as given by Eqs. (3)-(6), and a chemical potential $\Delta\mu$ is applied across them, the current across each junction will oscillate as $I_1 \sin(\phi_1(t))$ and $I_2 \sin(\phi_2(t))$, respectively. By integrating the superfluid loop, $$\oint \nabla\phi \cdot dl = \phi_1(t) - \phi_2(t) + \phi_{ext}(t) \quad (13)$$
$$= 2\pi n,$$

where $\phi_{ext(t)}$ is an external phase shift, i.e., the Sagnac phase shift for rotation, or the Gouy phase shift for acceleration. Hence the amplitude of the total current can be written $$I(t) = (I_1 + I_2)\sqrt{\cos^2\left(\frac{\phi_{ext}(t)}{2}\right) + \xi^2 \sin^2\left(\frac{\phi_{ext}(t)}{2}\right)}, \quad (14)$$

where $\xi=(I_1-I_2)/(I_1+I_2)$ describes the asymmetry across the Josephson junction. The pSQUID is a charge neutral and room-temperature operational version of a dc-SQUID. However, a charged supercurrent device can be obtained by implementing Josephson junctions with quatron-polaritons. When the pSQUID is placed in a rotating frame, the polariton superfluid rotates in a direction normal to the partition walls containing the Josephson junctions, thereby functioning as a quantum inertial sensor.

The Gouy phase is the phase that a wave acquires as it changes its radius of curvature due to diffraction. The Gouy phase of optical beams can be observed by interference, i.e., superposing a fundamental Gaussian beam going through a focal point with a plane wave. Hence, $$\phi_{Gouy}(t) = (\alpha + 1)\tan^{-1}\left[\frac{z(t)}{z_R}\right] \quad (15)$$

is the Gouy phase, $z_R$ is the Raleigh range, and $\alpha=2p+|l|$. When considering a superposition of two LG modes with topological charges 1 and −1, the total state is $$|\psi\rangle = \sin(\theta)|\ell_1=\ell\rangle + \cos(\theta)|\ell_2=-\ell\rangle \exp(i\delta), \quad (16)$$

where $\delta$ is the relative phase between the two beams. Eq. (16) describes the amplitude of the beam in FIGS. 1 and 2 after it has passed through the BS 109 or the OAM emitter 201. For a two-dimensional condensate such as a polariton BEC, the angular change in the vortex position between two points along the z-direction is $$\dot{\phi}_{Gouy}(t) = \frac{|\ell_2| - |\ell_1|}{\ell_2 - \ell_1}\left[\frac{\dot{z}t}{z_R}\right]. \quad (17)$$

It has recently been shown that laser injection methods can be used to generate counter-rotating polariton BEC superpositions as seen in Eq. (16). Via Eq. (12), an exciton-polariton (i.e., polariton) superfluid is a type of BEC that can be achieved at much higher temperatures than typical BECs. Assuming p=0, the dynamic phase $\delta$ is constant in Eq. (16), and $l_1=1$, $l_2=-1$ then $$\dot{\phi}_{Guoy}(t) = (\alpha+1)\left[\frac{z_R \dot{z} t}{z_R^2 + z^2}\right]. \quad (18)$$

For a two-dimensional condensate, Eq. (18) is $$\dot{\phi}_{Guoy}(t) = (\alpha+1)\left[\frac{\dot{z}t}{z_R}\right]. \quad (19)$$

The signal-to-noise ratio (SNR) and the estimates for achievable sensitivity in a polariton Gouy accelerometer is discussed below. The SNR is given by the phase shift, i.e., Eq. (19), to the shot noise that depends on the number of photons N at the detector from the condensate per second, $$SNR = \frac{\dot{\phi}_{Guoy}(t)}{\sqrt{1/N}}. \tag{20}$$

The final SNR has a maximum at a certain rate of photon detection, and the sensitivity $\dot{z}_{min}$ is calculated by setting SNR=1. Thus, for the OAM superposition, $$\dot{z}_{min} = \frac{z_R}{t\sqrt{N}\,(\alpha+1)}. \tag{21}$$

Typical polariton densities are in the region of $10^9$ [cm$^2$], and a polariton spot size of 100 [μm$^2$] gives a polariton number in the region of $10^3$. The lifetime of the polaritons is in the region of ~10 [ps], hence the number of signal photons can be estimated as N~$10^{14}$ [s$^{-1}$] for polaritons. The Rayleigh range $z_R$ is ~$1\times10^4$ [cm]. This gives an estimate for the polariton vortex-antivortex superposition as $$\dot{z}_{min}\sim 5\times 10^{-9} [\text{m}\cdot\text{sec}^{-1}\cdot\text{Hz}^{-1/2}]. \tag{22}$$

Here, it should be pointed out that if $|l_2|\neq|l_1|$ in Eq. (17), Gouy phase changes can be detected via rotations of the quantum interference. However, for a vortex superposition where $|l_2|=|l_1|$, Eq. (19) can be used to determine the Gouy phase shift, as there will be no rotations of the quantum interference. OAM superposition states of light, i.e., Eq. (16) can be generated by passing a TEM$_{00}$ beam mode through a SPP, followed by a MZI with a DP. The SPP converts the TEM$_{00}$ to a LG$_{l,p}$ beam mode Eq. (1) of quantized OAM with quantum numbers l and p, and the DP changes the winding of the quantized OAM from l to -l. In addition to generation using SPPs, cylindrical lens mode converters, spatial light modulators, and computer generated holograms are alternative methods to generate integer quantized OAM superposition states. Alternatively, an OAM emitter 201 can be used to generate the OAM superposition states of light, as seen in FIG. 2. The LG$_{l,p}$ beam modes form a complete orthonormal basis set of solutions for paraxial light beams commonly found in lasers. These modes can be expressed by Eq. (1).

Typical polariton effective masses are $m_{eff}\sim 10^{-4}\,m_e$, where $m_e$ is the electron mass. By comparing the rest mass energy of polaritons to the photon energy, $m_{eff}c^2/\hbar\omega\sim 1$. In a polariton BEC where the phase around a vortex is fixed topologically by the OAM winding number l, a phase of $2\pi l$ accumulates about the vortex. Since the Sagnac phase originates from the interference of two counter-rotating orbital angular momentum, the Sagnac phase is written $$\phi_{Sagnac}(t)=2l\dot{\phi}t. \tag{23}$$

For polariton BECs the Sagnac phase can be written $$\phi_{Sagnac}(t) = N(t)\frac{4m_{eff}A_{loop}}{\hbar}\dot{\phi}, \tag{24}$$

where N(t) is the number of times a polariton traverses the loop in time t. For the pSQUID ring geometry of radius r, $$N(t) = \frac{\hbar k_0 t}{2\pi r m_{eff}}, \tag{25}$$

where the momentum mode $k_0=mv/\hbar$. Therefore, in a pSQUID the Sagnac phase is $$\phi_{Sagnac}(t)=2k_0 r\dot{\phi}t, \tag{26}$$

where r~100 [μm] and $k_0$~10 [μm$^{-1}$], such that $k_0 r$~$10^3$. When the laboratory frame of reference rotates in time, the density profile, i.e., quantum interference of the condensate reads $$|\psi(x,t)|^2+|\psi(x,t)|^2\cos[2k_0 r(\phi+\dot{\phi}t)], \tag{27}$$

allowing for quantum gyroscopic measurements to be taken from imaging the condensate rotating as a function of time. The SNR is given by the ratio of the Sagnac phase shift to the shot noise as a function of the number of photons luminescing from the condensate per second $$SNR = \frac{\phi_{Sagnac}(t)}{\sqrt{1/N}}. \tag{28}$$

The sensitivity $\dot{\phi}_{min}$ is found by setting SNR=1. For the vortex-antivortex superposition in the pSQUID geometry $$\dot{\phi}_{min} = \frac{1}{2k_0 rt\sqrt{N}}. \tag{29}$$

Polariton densities are ~$10^9$ [cm$^{-2}$], and occupy an area of ~100 [μm$^2$] such that N~$10^3$. As such, for the vortex-antivortex superposition in the pSQUID, $$\dot{\phi}_{min}\sim 5\times 10^{-11}[\text{rad}\cdot\text{s}^{-1}\cdot\text{Hz}^{-1/2}]. \tag{30}$$

From Eq. (13) the phase difference across the Josephson junctions is $$|\phi_1(t)-\phi_2(t)|=2\pi n-2k_0 r\dot{\phi}t. \tag{31}$$

Moreover, using Eq. (14), the current amplitude in the pSQUID is $$I(t) = (I_1+I_2)\sqrt{\cos^2(k_0 r\dot{\phi}t)+\eta^2\sin^2(k_0 r\dot{\phi}t)}, \tag{32}$$

where $\eta=(I_1-I_2)/(I_1+I_2)$ describes the asymmetry across the Josephson junctions. Alternatively, Eq. (14) can be written using Eq. (23) as $$I(t) = (I_1+I_2)\sqrt{\cos^2(l\dot{\phi}t)+\eta^2\sin^2(l\dot{\phi}t)}, \tag{33}$$

or Eq. (14) can be written in terms of the Gouy phase Eq. (17), $$I(t) = (I_1+I_2)\sqrt{\cos^2\left[\frac{|\ell_2|-|\ell_1|}{2(\ell_2-\ell_1)}\frac{\dot{z}t}{z_R}\right]+\eta^2\sin^2\left[\frac{|\ell_2|-|\ell_1|}{2(\ell_2-\ell_1)}\frac{\dot{z}t}{z_R}\right]}. \tag{34}$$

Allan variance is a method that is used to measure frequency stability in oscillators, or to determine the intrinsic noise in a system as a function of the averaging time. The Allan variance provides information related to five basic noise terms relevant to inertial sensor data. Namely, these noise terms are quantization noise, Angle Random Walk (ARW), Velocity Random Walk (VRW), Bias Instability (BI), rate random walk, and rate ramp. The Allan variance analysis of a time domain signal $\Omega(t)$ consists of computing its root Allan variance or Allan deviation as a function of different averaging times T. Here, the time domain signal will be given by Eq. (22) for the accelerometer, and Eq. (30) for the gyroscope. The Allan variance can be computed in terms of the output angles θ, corresponding to each gyro, or accelerometer rate sample. As such, $$\theta(t) = \int^t \Omega(t') dt'. \tag{35}$$

These angle measurements are made at times $t=k\tau_0$ where k varies from 1 to N, i.e., $(\tau_0, 2\tau_0, 3\tau_0, \ldots, N\tau_0)$. For a discrete set of samples, a cumulative sum can also be used to give N values of θ. Here the cumulative sum of the gyro or accelerometer output samples at each $k\tau_0$ is taken and each sum obtained is then multiplied by sample period $\tau_0$ to give N values of θ. Once N values of θ have been computed, the Allan variance is calculated using equation $$\sigma^2(\tau) = \frac{1}{2\tau^2} \langle (\theta_{k+2m} - 2\theta_{k+m} + \theta_k)^2 \rangle \tag{36}$$

where $\sigma^2(\tau)$ represents Allan variance as a function of τ and $\langle \ \rangle$ is the ensemble average. Upon expanding the ensemble average in Eq. (36), $$\theta^2(\tau) = \frac{1}{2\tau^2(N-2m)} \sum_{k=1}^{N-2m} (\theta_{k+2m} - 2\theta_{k+m} + \theta_k)^2 \tag{37}$$

where N is the total number of samples, m is the averaging factor, $\tau=m\tau_0$ is the averaging time and K is a set of discrete values varying from 1 to N. Eq. (37) computes the final rate Allan variance (e.g., via overlapping method) value using output angle θ for one particular value of τ. Once the output angle values of θ are known, the sample period and the value of m, Eq. (37) can be used to compute Allan variance. Finally, taking the square root of the result obtained from (37) to obtain the value of the root Allan variance or the Allan deviation for a particular value of T. This result characterizes the noise in the device, $$AD(\tau) = \sqrt{AVAR(\tau)}. \tag{38}$$

White noise (i.e., random walk) appears on an Allan variance plot where the slope is −0.5. The random walk measurement (ARW for a rate-gyroscope, VRW for an accelerometer) is obtained at τ=1. From FIG. 7, it can be seen that for the polariton accelerometer $$VRW \sim 10^{-5} [\text{m} \cdot \text{s}^{-1} \cdot \text{Hz}^{-1/2}]. \tag{39}$$

Figure 7:
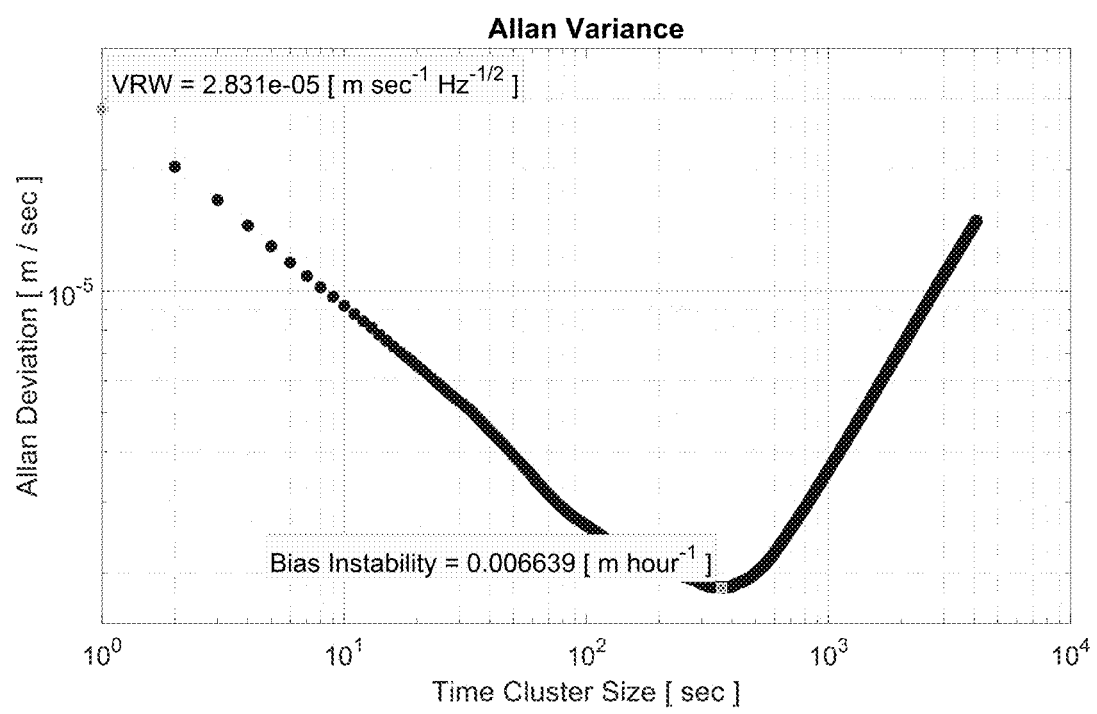
FIG. 7 is an Allan variance curve corresponding to the polariton accelerometer in the presence of additive white gaussian noise (AWGN) in accordance with the present disclosure.

Allan variance curve (dots) in FIG. 7 correspond to the polariton accelerometer in the presence of AWGN with a SNR of 1 (i.e., 0 dB). The BI and VRW values are distinctly marked on the figure.

Figure 8:
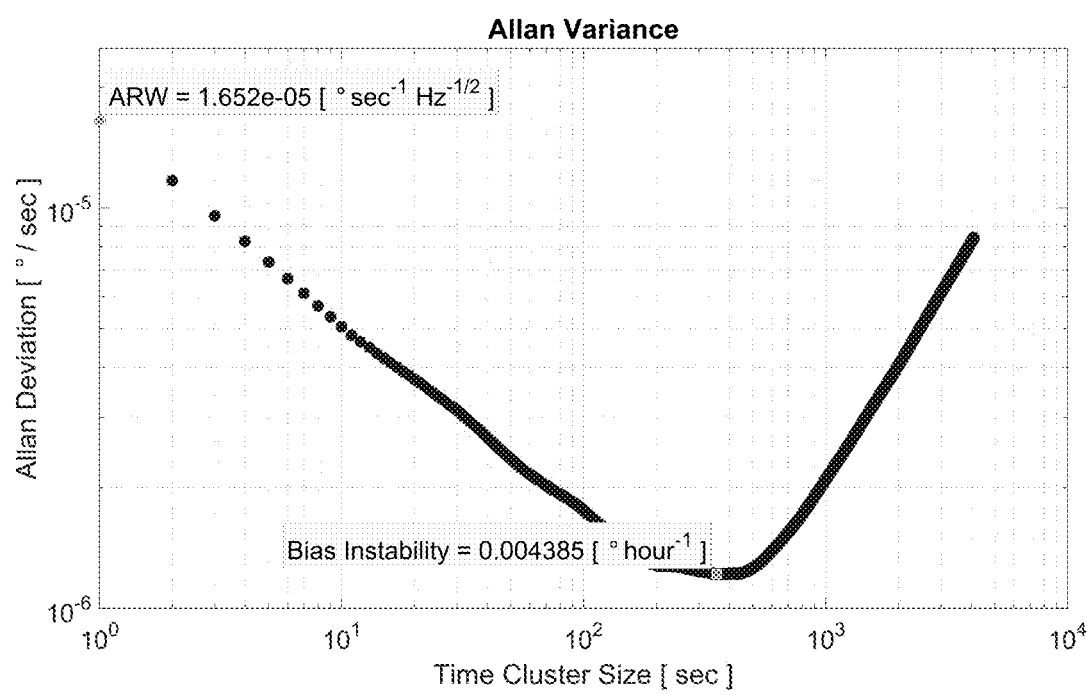
FIG. 8 is an Allan variance curve corresponding to the polariton gyroscope in the presence of additive white Gaussian noise (AWGN) in accordance with the present disclosure.

FIG. 8 shows the Allan variance curve (dots) corresponding to the polariton gyroscope in the presence of AWGN with a SNR of 1 (i.e., 0 dB). The BI and ARW values are distinctly marked on the figure.

Moreover, from FIG. 8, it can be seen that for the polariton gyroscope $$ARW \sim 10^{-5} [° \cdot \text{s}^{-1} \cdot \text{Hz}^{-1/2}]. \tag{40}$$

BI appears on an Allan Variance plot at the minimum. For a pIMU, the BI measures how the bias of the polariton accelerometer or polariton gyroscope changes over a specified period of time at constant temperature. From FIG. 7, it can be seen that the BI for the polariton accelerometer is $$BI_{accel} \sim 10^{-3} [\text{m} \cdot \text{hr}^{-1}]. \tag{41}$$

Moreover, from FIG. 8, it can be seen that the BI for the polariton gyroscope is $$BI_{gyro} \sim 10^{-3} [° \cdot \text{hr}^{-1}]. \tag{42}$$

Results were obtained using the MATLAB code found in section VI, where the number of samples $N=10^4$, and the sample period $\tau_0=1$ sec.

TABLE I

| Technology | $\Omega_{min}$ [rad · s$^{-1}$ · Hz$^{-1/2}$] | BI [° · hr$^{-1}$] | ARW [° · s$^{-1}$ · Hz$^{-1/2}$] | Sensitivity Enhancement |
|---|---|---|---|---|
| Polariton BECs | 5 × 10$^{-11}$ | 0.004385 | 1 × 10$^{-5}$ | 720,000 |
| Ultracold Atoms | 6 × 10$^{-10}$ | 0.04564 | 2 × 10$^{-4}$ | 72,000 |
| Ring Laser Gyro (1 m$^2$) | 1.3 × 10$^{-9}$ | 0.1067 | 4 × 10$^{-4}$ | 6,000 |
| Superfluid Helium | 2 × 10$^{-7}$ | 16.82 | 0.06535 | 4,000 |
| Fiber Optic Gyro (Commercial) | 3 × 10$^{-7}$ | 25.56 | 0.1004 | 26 |
| Nanofabricated Gratings | 3.6 × 10$^{-6}$ | 281.2 | 1.192 | 12 |
| Moiré Classical Fringes | 3.6 × 10$^{-5}$ | 2603 | 11.9 | 1 |

In classical electronic computing, information is usually encoded and accessed by adjusting and monitoring voltages on transistor switches inside integrated circuits. Each electronic transistor is set to a voltage state of either 0 or 1. In this way, electrical voltage is used to encode bits of information. As discussed above, polaritons are a neutral species, thereby disqualifying them for use as voltage state representations. As such, a charged supercurrent is needed to replace the voltage state representations of the classical transistor, as the supercurrent can represent a voltage state of 0 and 1 simultaneously, via superposition. In this way, room-temperature quatron superconductors can be used to build quantum transistors that replace the classical electronic transistors.

Quatrons are hybrid or quasi-particle optical-matter wave systems, which enable the quantum properties of light to be exhibited by matter waves. For example, as discussed above, OAM states are properties of light, which represents a Hilbert space. The Hilbert space found in the phase of photons allows quatron condensates to encode quantized phase information. Like polaritons, quatrons can exhibit BEC states at room-temperatures due their small effective masses. This allows matter-waves of room temperature superconducting quatrons.

Quatrons can therefore act as qudits, or quantum units of information. When the value of "d" is equal to two, qudits act as qubits, and can be made to represent and replace the binary voltage states of the classical transistor. Thus, quatron based quantum transistors are comparable to the classical electronic transistors. While classical transistors permit the encoding of two different voltage states one at a time, quantum transistors instead encode two or more magnetic field states simultaneously. This encoding of states is known as superposition and can be achieved in quatrons by using the photon coupling of OAM states as shown in connection with FIG. 2.

The superposition of the d-OAM states as magnetic fields allow the quatron OAM states to act as room-temperature quantum transistors. The magnetic field states correspond to the superposition states of the quatron condensate, originating from the OAM photon coupling. The quantum information can then be stored in a magnetic memory element local to each device. After the quantum computation is completed, the qubits can be measured and collapsed into their classical 0 or 1 states. The readouts can be used to query the value held by each qubit, and return the answer as a bit string of 0s and 1s.

Quatrons are composed of a hole and three-electrons coupled to photons in triple quantum layers inside semiconductor microcavities, for example. This makes qSQUIDs an ideal solution for replacing the classical electronic transistors, as quatrons are optically accessible bosons, capable of condensing at room-temperatures. These quatron qudits or qubits can be constructed into larger logical arrangements, and these larger logical arrangements can be made into larger computing elements that permit interaction, logical and mathematical operations, and the exchange and storage of information. In this way room-temperature programmable quantum computing can be achieved.

The quatron computing elements described are different from the classical Von Neuman architecture. One reason for this difference is that each qudit or qubit is associated with its own memory instead of centralizing such memory elements in, for example, a processor cache. In this way, the quatron based computing elements are neuromorphic in that the qudits or qubits behave more as neurons and the couplers accordingly act as synapses that control the flow of information between those neurons. This neuromorphic behavior will be beneficial to applications such as machine learning, as patterns can be instantiated in the architecture itself resulting in feedback loops between "hardware" and "software" in the devices.

FIG. 2 gives an example of an experimental configuration for the room-temperature qSQUID 200. An incident Gaussian beam of photons is passed through the waveguide to produce OAM vortex superpositions of light. This light is then passed through the Bragg Mirror configuration to produce a quatron-polariton Bose-Einstein condensate. Josephson junctions can be placed in a ring geometry inside the distributed Bragg reflector configuration, such that the device generates magnetic flux quantum $\Phi_0$, capable of being measured by the Hall effect sensor 206 at the output. If the 2DEG component is removed from the system, the supercurrent will be charge neutral, thereby making it a polariton superfluid quantum interference device, in which case the Hall effect sensor 206 will need to be replaced with a photon detector, e.g., a CCD.

From FIG. 2 it can be seen that a Gaussian beam 202 is passed through a variable amplitude splitter 204 and phase shifter 203 such that the OAM emitter 201 generates an OAM superposition state of light. The OAM superposition state is then passed through a triple quantum layer 205 such that a quatron BEC is made. Owing to the phase of the OAM superposition state, the quatron BEC in the triple quantum layer 205 will obtain a vortex-antivortex superposition. Moreover, a circular channel can be placed in the triple quantum layer 205 such that a superconducting loop is obtained. Josephson junctions can be placed in the superconducting loop in the triple quantum layer 205 such that magnetic flux quanta are generated. The magnetic flux quanta can then be detected at the output of the device via the Hall effect sensor 206. Furthermore, the input coil and pickup loop 208 can be used to sense magnetic flux at the output of the device. In the quatron system, or the quatron superconducting quantum interference device (qSQUID) 200 as seen in FIG. 2, letting D be the distance between the layers of the triple-layered microcavity, $r_1=r_h-r_{e1}$, $r_2=r_h-r_{e2}$, and $r_3=r_h-r_{e3}$, where $r_h$ is the radius vector of the hole, and $r_{e1}$ is the radius vector of the electron in the 2DEG layer, and $r_2$ and $r_3$ are the radius vectors of the electrons in the BEC layer, $\mu_1=m_{e1}m_h/(m_{e1}+m_h)$, $\mu_2=m_{e2}m_h/(m_{e2})+m_h$, $m_h$, $m_{e1}$, and $m_{e2}$ are the effective masses of the hole and electron in the 2DEG layer and the electron in the BEC layer, then the Hamiltonian reads $$\hat{H} = \begin{bmatrix} \hat{H}_{coul} & V\delta(r_1) \\ V\delta(r_1) & \hbar\omega_c \end{bmatrix} \quad (43)$$

where $\hbar\omega_c$ is the energy of the bare cavity mode, and V describes the exciton-photon coupling. Furthermore, $$\hat{H}_{coul} = \sum_{i=1,2,3} \frac{\hbar^2}{2\mu_i} \frac{1}{r_i} \frac{\partial}{\partial r_i}\left(r_i \frac{\partial}{\partial r_i}\right) + \frac{1}{r_i^2} \frac{\partial^2}{\partial \phi_i^2} - \frac{e^2}{\varepsilon r_1} - \frac{e^2}{\varepsilon\sqrt{D^2 + r_2^2}} - \quad (44)$$

$$\frac{e^2}{\varepsilon\sqrt{D^2 + r_3^2}} + \frac{e^2}{\varepsilon\sqrt{D^2 + r_1^2 + r_2^2 - 2r_1 r_2 \cos(r_1, r_2)}} +$$

$$\frac{e^2}{\varepsilon\sqrt{D^2 + r_1^2 + r_3^2 - 2r_1 r_3 \cos(r_1, r_3)}} +$$

$$\frac{e^2}{\varepsilon\sqrt{(2D)^2 + r_3^2 + r_2^2 - 2r_3 r_2 \cos(r_3, r_2)}},$$

where e is the elementary charge. The vector for the superposition of OAM states in the quatron system is of the form $$\begin{bmatrix} \alpha\psi(r_i\phi_i, t) \\ \beta \end{bmatrix} = \begin{bmatrix} \alpha\frac{(|\ell\rangle + |-\ell\rangle)}{\sqrt{2}} \\ \beta \end{bmatrix}, \quad (45)$$

where $\alpha=\beta/\sqrt{S}=\sqrt{2}/2$, S is the surface area, and $|\ell\rangle$ is given by Eq. (1). A charged supercurrent device can be obtained by implementing the Josephson junctions with quatrons. For the case when the quatron system, i.e., the qSQUID as shown in FIG. 2 contains two Josephson junctions, the superconducting phase evolution is given by $$U(t) = -\frac{\hbar}{2e}|\phi_1(t) - \phi_2(t)|, \quad (46)$$

owing to the quatron charge −2e. Rewriting Eq. (46) using Eq. (31) for the ring geometry, such that $$U_{k_0}(t) = -\frac{\hbar}{e}[\pi n - k_0 r \dot\phi t] \quad (47)$$

where n is integer valued, and represents the periodicity of the superconducting loop, as in Eq. (13). Alternatively, in terms of the (superconducting) magnetic flux quantum $\Phi_0$, rewriting Eq. (47) as $$U_{k_0}(t) = -\Phi_0\left[n - \frac{k_0 r \dot\phi t}{\pi}\right]. \quad (48)$$

This allows the measurement of the superconducting phase as a function of the Sagnac phase in the ring geometry.

A qubit (i.e., a two-level quantum system), evolves in a Hilbert space spanned by two basis vectors usually denoted $|0\rangle$ and $|1\rangle$ in analogy with classical information. For a pure state, it can be represented by:

$$|\psi\rangle = a|0\rangle + b|1\rangle \quad (49)$$

Where a and b are complex and $|a|^2+|b|^2=1$. In terms of polariton BECs created via OAM states of light carrying quantized OAM $l\hbar$, defining the corresponding logical basis vectors as $|0\rangle=|+\ell\rangle=|R\rangle$ and $|1\rangle=|-\ell\rangle=|L\rangle$. Here, R and L refer to the right and left handedness of the helical wavefront, respectively. In analogy to the case of a polarization basis, the specific following modes as vertical, diagonal, horizontal and anti-diagonal are denoted as:

$$|V\rangle = \frac{|R\rangle - |L\rangle}{\sqrt{2}}, |D\rangle = \frac{|R\rangle + i|L\rangle}{\sqrt{2}}, \quad (50)$$

$$|A\rangle = \frac{|R\rangle - i|L\rangle}{\sqrt{2}}, |H\rangle = \frac{|R\rangle + |L\rangle}{\sqrt{2}}. \quad (51)$$

The bases $|R\rangle$, $|L\rangle$, $|H\rangle$, $|V\rangle$, and $|D\rangle$, $|A\rangle$ will constitute the 3 mutually unbiased bases necessary to form a Bloch sphere. If the normalization is written implicitly and the global phase is ignored, Eq. (49) can now be rewritten as $$|\Psi\rangle = \cos\left(\frac{\theta}{2}\right)|R\rangle + \sin\left(\frac{\theta}{2}\right)\exp(i\phi)|L\rangle \quad (52)$$

For example, in a Franson interferometer configuration, an entangled state can be obtained, such that $$|\Phi\rangle = \frac{|L\rangle_A|L\rangle_B + \exp(\phi_A + \phi_B)|R\rangle_A|R\rangle_B)}{\sqrt{2}} \quad (53)$$

Figure 6:
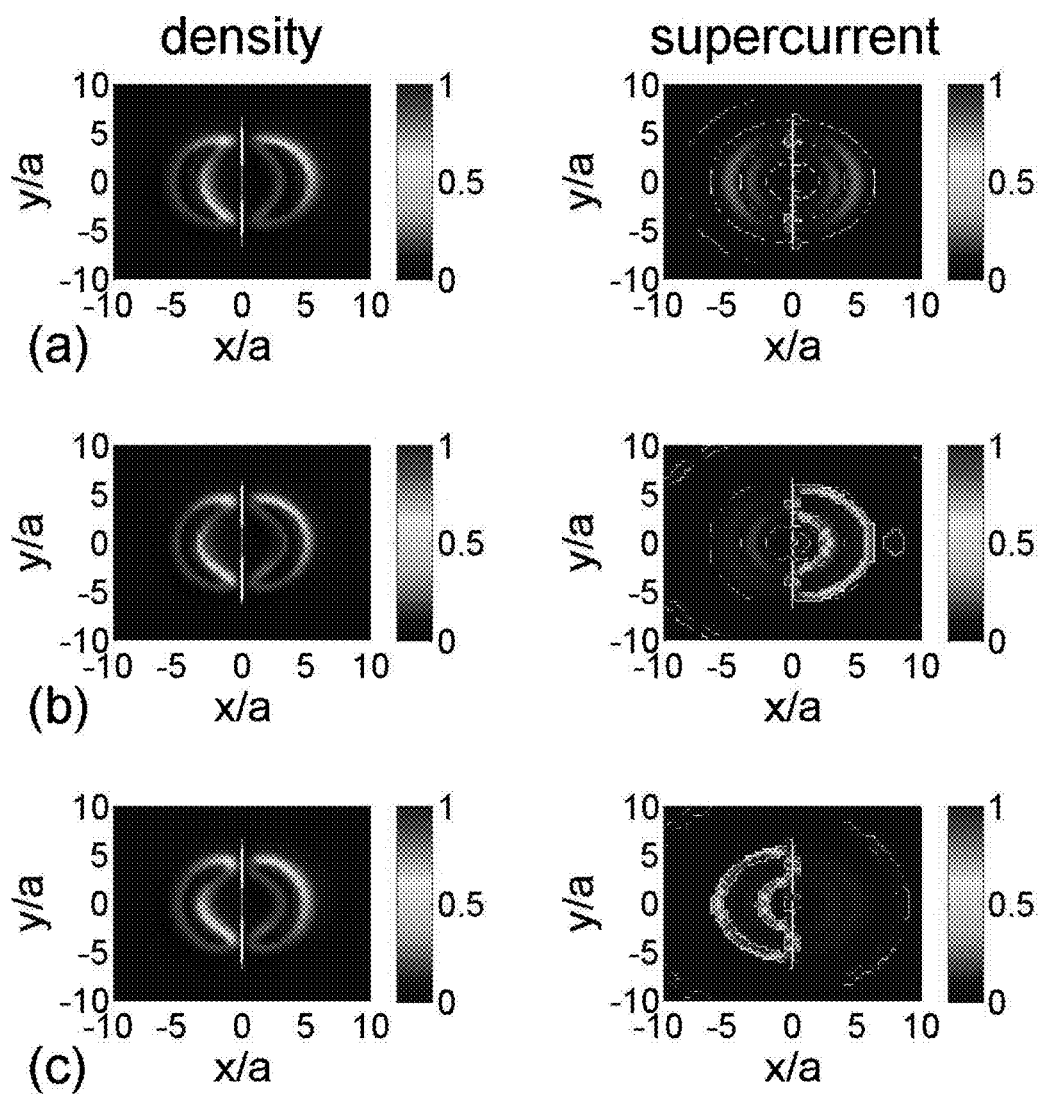
FIG. 6 is a diagrammatic view of a time evolution of a quatron BEC in a ring potential landscape with Josephson junctions in accordance with the present disclosure.

Once the charged quatron superconductor inherits an OAM $l\hbar$, a quantized flux will be generated. As such, the superconducting phase can be written in terms of the OAM, $$U_\ell(t) = -\Phi_0\left[n - \ell\frac{\dot\phi t}{\pi}\right] \quad (54)$$

to induce a flux quantum, where l is the OAM winding number, $\dot\phi$ is the angular velocity of the condensate, and n is integer valued, representing the periodicity. In this context, it is useful to discuss the various types of qubits (i.e., quantum bits). There are two primary types of qubits that exploit the superconductivity of Cooper pairs (i.e., electron-electron pairs), namely, charge qubits and flux (i.e., phase) qubits. The Josephson junction is the basic building block of a superconducting qubit, and consequently the basic entity of a quantum computer or a quantum simulator. The Josephson junction consists of two superconducting regions separated by a "weak link." Following this reasoning, a quatron superconducting flux qubit, where a pair of conductivity electrons is linked with an exciton-polariton by Coulomb interaction, and used analogously to the Cooper pairs of the superconducting flux qubit. In this case, a quatron flux qubit consists of a ring of one or more Josephson junctions. For the case of a ring of superconducting quatron BEC, two Josephson junctions are implemented. For example, using orbital angular momentum of light, one can encode $|0\rangle$ and $|1\rangle$ data into these counter-rotating quatron superconducting states, effectively constituting a novel quatron flux qubit using Eq. (16). Herein, the advantages of room-temperature quatron BEC and Josephson junction based implementations are combined. The basic idea is to use a ring of quatron BEC to realize a room-temperature quatron BEC analogue of the superconducting flux qubit and similar technologies. Supercurrents flowing in a ring provide a physical implementation of a qubit, as they generate a flux characteristic to the state of the qubit being measured. In this way, quatron flux qubits with supercurrents flowing in a ring-shaped geometry rotated by Josephson junction(s) induce a flux. In quatron condensates, the supercurrent is caused by a gradient in the macroscopic phase $$J_s = -2e\rho_s\left[\frac{\hbar}{m_{\text{eff}}}\nabla\phi_{\text{ext}}(x, t) + \frac{2e}{m_{\text{eff}}}A(x, t)\right], \quad (55)$$

where A(x, t) is the magnetic vector potential, and $m_{\text{eff}}$ is the quatron effective mass. Furthermore, in a circular loop, Eq. (55) can only change as a multiple of $2\pi$, meaning that the supercurrent is always quantized in this particular geometry, as seen in FIG. 6. Flux quantization is the direct result of the macroscopic coherence that is inherent to BECs. Condensates of quatron-polaritons exist at room temperatures. A quatron is a pair of conductivity electrons coupled with an exciton-polariton via Coulomb interaction, and thus a quatron carries charge 2e. Because quatrons are optically accessible bosons, they can be coupled with the photon OAM to create states as seen in Eq. (49).

INS generally involve using rotation (gyroscope), and acceleration (accelerometer) sensors to determine a location relative to a given starting point. Some of the applications for INS include, but are not limited to attitude and heading reference systems (AHRS), Global Position Systems (GPS), submarines, aerospace vehicles, petroleum exploration, drilling, and automobiles. An INS typically requires three accelerometers and three gyroscopes one for each physical axis. The accelerometers can be used to determine tilt based on the projection of gravitational acceleration onto each axis.

The GPS satellite system is not sensitive to angular orientation or rotation rate and so gyroscopes are still required for many applications, even where GPS can be utilized. Differential GPS utilizes additional information supplied by local transmitters and therefore can be used to enhance accuracy. Moreover, and particularly for military applications, the signals from GPS satellites are thought to be vulnerable to jamming and the satellites are themselves vulnerable to attack. Additionally, satellite signals cannot be received under water, dense urban environments, or even where heavy-tree cover is encountered. Accordingly, there remains a need for sensitive INS systems that do not rely upon the GPS satellite system, if even only as a supplement. In such conditions, even small biases in the readings of accelerometers or gyroscopes can result, over time, in increasing errors in navigation.

Figure 9:
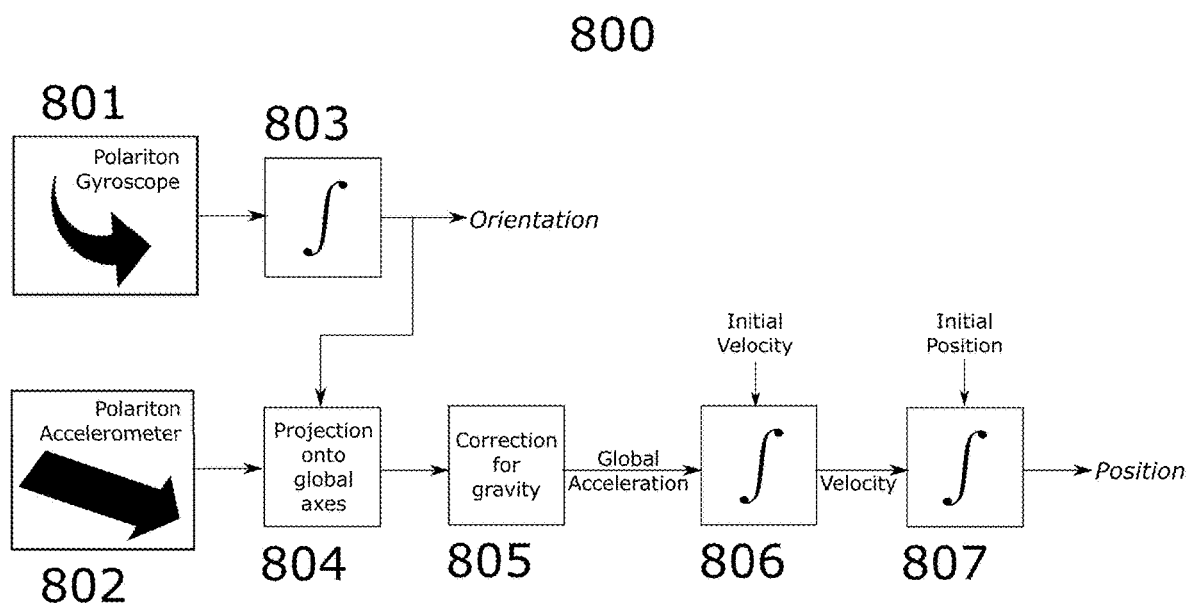
FIG. 9 is a conceptual description of a polariton Inertial Measurement Unit (pIMU) in accordance with the present disclosure.

FIG. 9 depicts a strapdown IMU (sometimes also referred to as an INS) navigation algorithm integrating the polariton accelerometers and polariton gyroscopes as discussed above into a pIMU 800.

Inertial navigation is a technique whereby measurements provided by accelerometers and gyroscopes are used to track the position and orientation of an object relative to a known starting point, orientation and velocity. These know starting points, orientations, and velocities typically represent the results of the calculations made at an initial time. Inertial navigation units typically include three at least partially orthogonal gyroscopes 801 and three at least partially orthogonal accelerometers 802 that measure angular velocity and linear acceleration respectively. By processing the measurements obtained from these devices it is possible to track the position and orientation of an object in three dimensional space.

To track the orientation of an object, the measurements obtained from the three axes of at least partially orthogonal gyroscopes 801 are integrated 803 using well-known mathematical techniques. To track the position of the object, three at least partially orthogonal accelerometers 802 are used. The measurements obtained from the three at least partially orthogonal accelerometers 802 are resolved into global coordinates or global axes 804 using the known orientation as determined by the integration of the gyroscope 801 measurements, again using well-known mathematical techniques.

Next, the IMU 800 corrects for the force of gravity on the object in block 805. The output of this set of calculations is the global acceleration of the object in three dimensional space. This global acceleration is integrated in block 806 using the initial velocity (calculated at the previous time interval) to obtain the current velocity. Next, the current velocity is integrated with the initial position (again, calculated at the previous time interval) to obtain the current position. The values of orientation, velocity and position are typically stored to be used for the calculation of orientation, velocity and position for the next time interval. Alternatively, the higher order derivatives of linear velocity, angular velocity and position can be taken.

As can be appreciated by those of ordinary skill in the art, the three at least partially orthogonal gyroscopes 801 can be constructed using the polariton gyroscopes discussed above. Likewise, the three at least partially orthogonal accelerometers 802 can be constructed using the various forms of the polariton accelerometers discussed above.

The resulting polariton-based gyroscopes and accelerometers of the present disclosure achieve high degrees of accuracy and sensitivity. Allan variance is a method that is used to measure the frequency stability in oscillators, or to determine the intrinsic noise in a system as a function of the averaging of time. The Allan variance provides information related to five basic noise terms relevant to inertial sensor data. Namely, these noise terms are quantization noise, angle random walk, bias instability, rate random walk, and rate ramp. In addition to navigational applications, the accelerometers and/or gyroscopes of the present disclosure can be used for other important applications that require exquisite sensitivity, such as determining small changes in the rotation rate of the Earth and the associated length of day fluctuations. Such fluctuations are caused primarily by tidal forces that alter the mass distribution of the oceans that cover most of the surface of the Earth. As a result, the rotation rate of the Earth (and thus the length of the day) alters correspondingly to conserve angular momentum. Likewise, the devices of the present disclosure can also be used in seismic monitoring. Little information exists regarding the rotational spectrum of earthquakes and other seismic events. Sensitive measuring devices such as described in the present disclosure can provide greater depth of information over currently used techniques, such as Very-long-baseline interferometry (VLBI) because they are much more portable than VLBIs and therefore can take local measurements.

Another application is in the field of torsion pendulums which are used, for example, to take measurements of the gravitational constant G. The devices described in the present disclosure are sensitive enough to allow the detection of thermal noise (that results in the geometry of the pendulum itself) and reduce the resulting systematic error.

Finally, the accelerometers and gyroscopes of the present disclosure have application in the field of general relativity testing the extent and limits of the Lense-Thirring effect and the impact of geodetic precession. Lense and Thirring predicted in 1918 that a satellite orbiting a rotating body would experience a precession of its orbit due to the rotating mass. The Lense-Thirring effect can be obtained in the limit of weak gravitational fields by considering the relativistic field equations in the linear approximation, and leads to off-diagonal terms in the metric. The effect on nearby space-time is similar to the behavior of a viscous fluid surrounding a rotating sphere, and is sometimes called the dragging of inertial frames.

It is believed the examples of the present disclosure and their advantages will be understood from the foregoing description, and it will be apparent that various changes may be made thereto without departing from the spirit and scope of the disclosure or sacrificing all of its advantages, the examples hereinbefore described merely being preferred or exemplary.

Those of ordinary skill in the art will appreciate any of the aforementioned techniques may be used without departing from the present disclosure.

VI. Appendix

```
1  % Allen Deviation
2  function [T,sigma] = allan(omega,fs,pts)
3  [N,M] = size(omega); % figure out how big the output data set is
4  n = 2.^ (0:floor(log2(N/2)))'; % determine largest bin size
5  maxN = n(end);
```

VI. Appendix

```
 6  endLogInc = log10(maxN);
 7  m = unique(ceil(logspace(0,endLogInc,pts)))'; % create log
    spaced vector average factor
 8  t0 = 1/fs; % t0 = sample interval
 9  T = m*t0; % T = length of time for each cluster
10  theta = cumsum(omega)/fs; % integration of samples over time to
    obtain output angle
11  sigma2 = zeros(length(T),M); % array of dimensions (cluster periods)
    X (#variables)
12  for i=1:length(m) % loop over the various cluster sizes
13    for k=1:N-2*m(i) % implements the summation in the AV equation
14      sigma2(i,:) = sigma2(i,:) + (theta(k+2*m(i),:) - 2*theta(k+m(i),:) +
        theta(k,:)).^2;
15    end
16  end
17  sigma2 = sigma2./repmat((2*T.^2.*(N-2*m)),1,M);
18  sigma = sqrt(sigma2);
 1  % Accelerometer
 2  t=1:10^4;
 3  % additive white Gaussian noise
 4  omega=transpose(awgn(5*10^(-9)*t,0,'measured'));
 5  [T,sigma] = allan(omega,1,10^4);
 6  loglog(T,sigma);
 7  find(sigma==min(sigma)) % find BI point
 1  % Gyroscope
 2  t=1:10^4;
 3  % additive white Gaussian noise
 4  omega=transpose(awgn((180/pi)*5*10^(-11).*t,0,'measured'));
 5  [T,sigma] = allan(omega,1,10^4);
 6  loglog(T,sigma);
 7  find(sigma==min(sigma)) % find BI point
```

What is claimed is:

1. A quasi-particle Superconducting QUantum Interference Device (SQUID) comprising:
a pumped microcavity quantum well device operable to generate a quasi-particle Bose-Einstein Condensate (BEC) when pumped, wherein the quasi-particle Bose-Einstein condensate has inherited unique Spin Angular Momentum (SAM) or Orbital Angular Momentum (OAM) quantum information; and,
a source of power for pumping the microcavity quantum well device wherein a pumping profile generates hot quasi-particles having a characteristic magnetic flux quanta
wherein the microcavity quantum well device includes a triple quantum layer and at least one Josephson Junction and is operated at room temperature to determine a property of a BEC.

2. The quasi-particle Superconducting QUantum Interference Device of claim 1 wherein the quasi-particles are quatron-polaritons.

3. The quasi-particle Superconducting QUantum Interference Device of claim 1 wherein the quasi-particle quantum interference device is used as a quantum computing element.

4. The quasi-particle Superconducting QUantum Interference Device of claim 3 wherein the quantum computing element is a quantum transistor.

5. The quasi-particle Superconducting QUantum Interference Device of claim 4 wherein the characteristic magnetic flux quanta generates a qudit of quantum information.

6. The quasi-particle Superconducting QUantum Interference Device of claim 1 wherein the pumped microcavity quantum well device comprises a two-dimensional electron gas (2DEG).

7. The quasi-particle Superconducting QUantum Interference Device of claim 1 wherein there are two or more quantum-entangled sources of power for pumping the microcavity quantum well device.

8. The quasi-particle Superconducting QUantum Interference Device of claim 1 wherein at least one input of the interference device uses a squeezed state of light or a squeezed vacuum state.

9. A quasi-particle Superconducting QUantum Interference Device comprising:
a pumped microcavity quantum well device operable to generate a quasi-particle Bose-Einstein Condensate (BEC) when pumped, wherein the quasi-particle Bose-Einstein Condensate (BEC) has quantum information capable of acting as a qudit, and wherein the quasi-particle Bose-Einstein condensate is in a quantum superposition, quantum-entangled, or any other quantum state, or interacting with at least one other quantum system; and,
a source of power for pumping the microcavity quantum well device wherein a pumping profile generates hot quasi-particles having a characteristic magnetic flux quanta,
wherein the microcavity quantum well device includes a triple quantum layer, and is operated at room: temperature to generate a quantum superposition state, a quantum-entangled state, or any quantum interference of the quasi-particle Bose-Einstein condensate(s).

10. The quasi-particle Superconducting QUantum Interference Device of claim 9 wherein the quasi-particle superconducting quantum interference device is associated with a magnetic (quantum) memory element that encodes quantized or otherwise electro-magnetic field quantum states of phase or density information.

11. The quasi-particle Superconducting QUantum Interference Device of claim 10, wherein the arrangement of quasi-particle-Superconducting QUantum Interference Devices produces a computational output.

12. The quasi-particle Superfluid QUantum Interference Device of claim 9, wherein the inherited quantum information results from pumping, quantum teleportation, or entanglement swapping.

13. The quasi-particle Superfluid QUantum Interference Device of claim 9, wherein the measured property is a Sagnac phase or Gouy phase.

14. A quasi-particle Superfluid QUantum Interference Device comprising:
a pumped microcavity quantum well device operable to generate a quasi-particle Bose-Einstein condensate when pumped, wherein the quasi-particle Bose-Einstein condensate has inherited unique quantum angular momentum or quantum orbital angular momentum information;
a source of power for pumping the microcavity quantum well device wherein a pumping profile generates hot quasi-particles having a characteristic phase information,
wherein the microcavity quantum well device includes a triple quantum layer and at least one Josephson Junction and is operated at room temperature to determine a property of a Bose-Einstein condensate.

15. A quasi-particle Superconducting QUantum Interference Device of claim 1 wherein the quasi-particle superconducting quantum interference device is associated with a magnetic memory element that encodes quantized or otherwise electro-magnetic field states.

16. An arrangement of the quasi-particle Superconducting QUantum Interference Devices of claim 15, wherein the arrangement of quasi-particle Superconducting QUantum Interference Devices produces a computational output.

17. A quasi-particle Superconducting QUantum Interference Device of claim 1, wherein the inherited quantum information results from pumping, quantum teleportation, or entanglement swapping.

18. A quasi-particle Superconducting QUantum Interference Device of claim 1, wherein the measured property is a Sagnac phase or Gouy phase.

\* \* \* \* \*